US012613276B2

(12) United States Patent
Bogaerts et al.

(10) Patent No.: US 12,613,276 B2
(45) Date of Patent: Apr. 28, 2026

(54) PHOTONIC WAVEGUIDE POWER AND PHASE MONITOR

(71) Applicants: IMEC VZW, Leuven (BE); Universiteit Gent, Ghent (BE)

(72) Inventors: Wim Bogaerts, Melle (BE); Liu Yichen, Ghent (BE); Yancan Wu, Ghent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 93 days.

(21) Appl. No.: 18/662,517

(22) Filed: May 13, 2024

(65) Prior Publication Data

US 2024/0385243 A1    Nov. 21, 2024

(30) Foreign Application Priority Data

May 16, 2023    (EP) ...................................... 23173555

(51) Int. Cl.
    *G01R 31/317*          (2006.01)
    *G01J 9/02*            (2006.01)
(52) U.S. Cl.
    CPC .......... *G01R 31/31728* (2013.01); *G01J 9/02* (2013.01); *G01J 2009/0288* (2013.01)
(58) Field of Classification Search
    CPC .................. G01R 31/31728; G01J 9/02; G01J 2009/0288; G02F 2201/58; G02F 1/0123; G02F 1/225
    See application file for complete search history.

(56) References Cited

U.S. PATENT DOCUMENTS

| | | |
|---|---|---|
| 10,742,324 B1 | 8/2020 | Padmaraju et al. |
| 2003/0035606 A1 | 2/2003 | Hajjar et al. |
| 2007/0146860 A1* | 6/2007 | Kikuchi .................. G02F 1/025 |
| | | 359/239 |
| 2008/0144988 A1 | 6/2008 | Ishii et al. |

(Continued)

FOREIGN PATENT DOCUMENTS

| | | | |
|---|---|---|---|
| EP | 3454111 A1 * | 3/2019 | ............. G02F 1/225 |
| EP | 3454111 B1 * | 11/2021 | ............. G02F 1/225 |

OTHER PUBLICATIONS

Extended European Search Report for Application No. 23173555.6 dated Oct. 23, 2023, 12 pages.

*Primary Examiner* — Tony Ko
(74) *Attorney, Agent, or Firm* — MOSER TABOADA

(57)          ABSTRACT

According to an aspect there is provided an optical monitoring device comprising:
  a first input for receiving a portion of a first optical signal coupled from a first waveguide into the first input;
  a second input for receiving at least a portion of a second optical signal coupled into the second input;
  a mixing unit for controlling combining of the portion of the first optical signal with the at least a portion of the second optical signal into a combined signal at an output from the mixing unit; and
  at least one photodetector for detecting the combined signal.
The optical monitoring device is configured to apply a modulation signal to modulate at least one of a phase of the portion of the first and/or second optical signal, a coupling of the portion of the first and/or second optical signal into the respective input, or an amplitude of the portion of the first and/or second optical signal being transferred into the combined signal.

13 Claims, 3 Drawing Sheets

(56)                References Cited

U.S. PATENT DOCUMENTS

Figure 1:
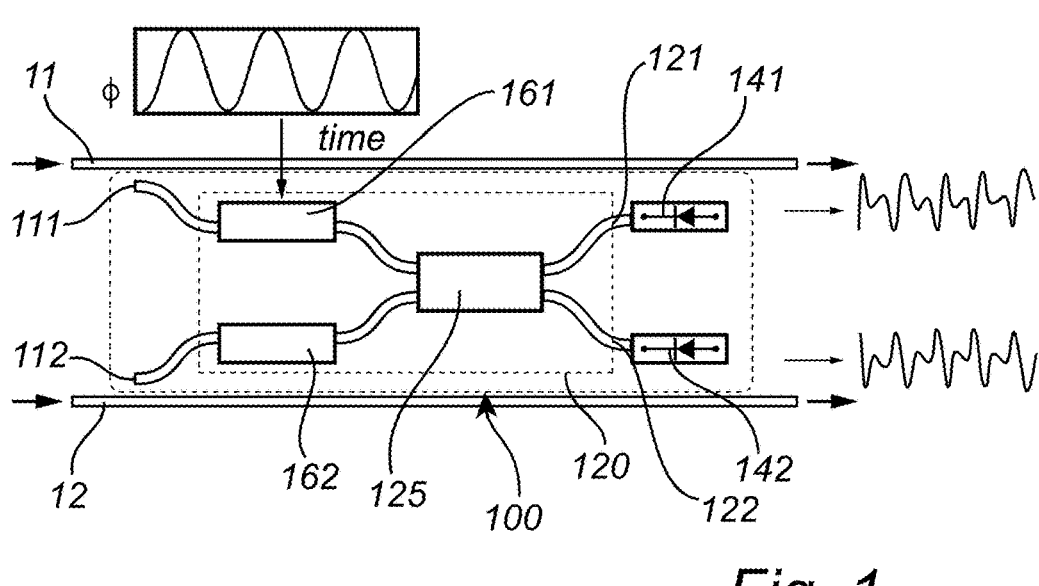

| | | |
|---|---|---|
| 2015/0277207 A1 | 10/2015 | Fujikata |
| 2018/0267340 A1 | 9/2018 | Rohde |
| 2020/0081313 A1 | 3/2020 | Padmaraju et al. |
| 2020/0150464 A1 | 5/2020 | Charbonnier et al. |

* cited by examiner

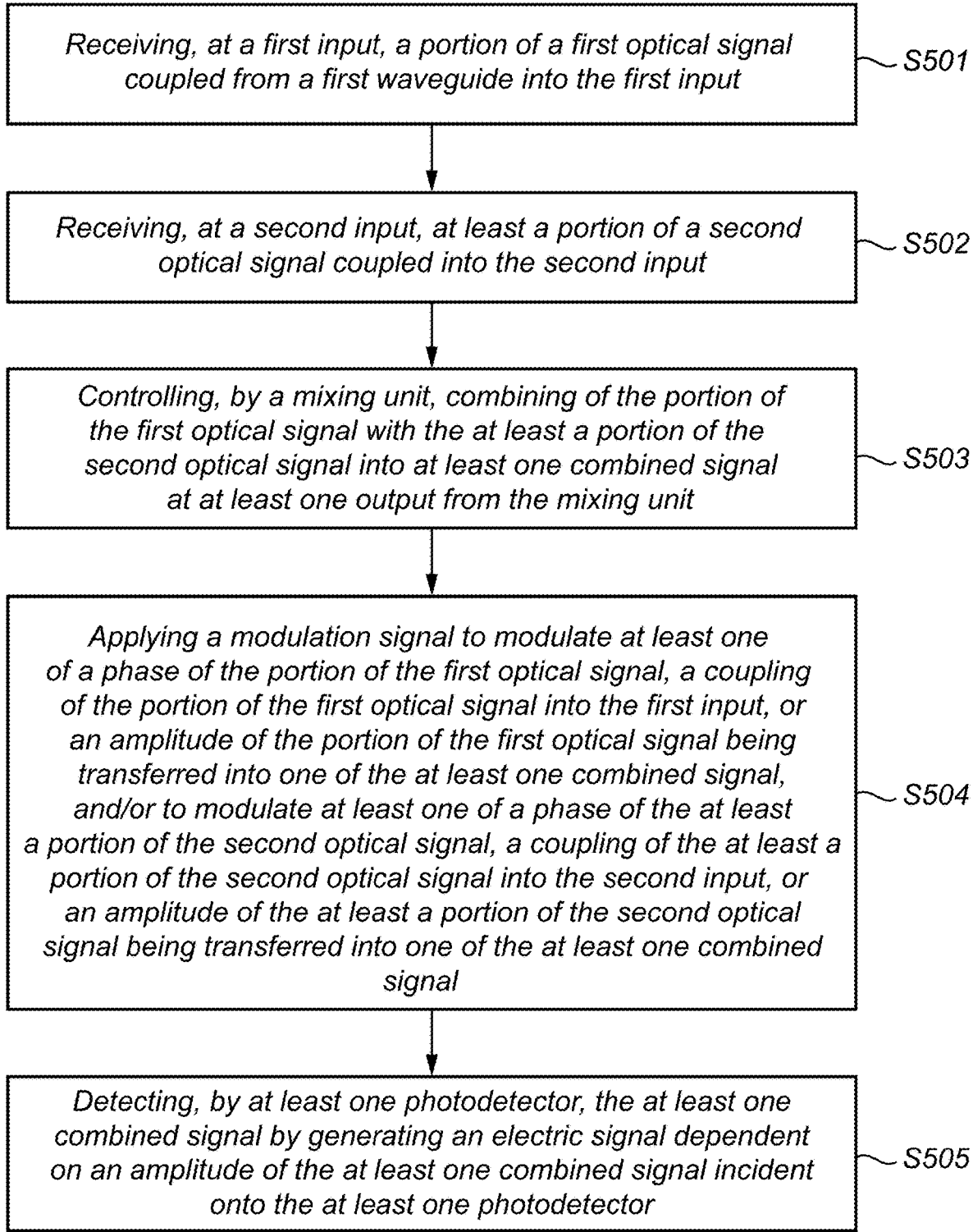

*Receiving, at a first input, a portion of a first optical signal
coupled from a first waveguide into the first input* ∽ S501

*Receiving, at a second input, at least a portion of a second
optical signal coupled into the second input* ∽ S502

*Controlling, by a mixing unit, combining of the portion of
the first optical signal with the at least a portion of the
second optical signal into at least one combined signal
at at least one output from the mixing unit* ∽ S503

*Applying a modulation signal to modulate at least one
of a phase of the portion of the first optical signal, a coupling
of the portion of the first optical signal into the first input, or
an amplitude of the portion of the first optical signal being
transferred into one of the at least one combined signal,
and/or to modulate at least one of a phase of the at least
a portion of the second optical signal, a coupling of the at least a
portion of the second optical signal into the second input, or
an amplitude of the at least a portion of the second optical
signal being transferred into one of the at least one combined
signal* ∽ S504

*Detecting, by at least one photodetector, the at least one
combined signal by generating an electric signal dependent
on an amplitude of the at least one combined signal incident
onto the at least one photodetector* ∽ S505

*Fig. 5*

PHOTONIC WAVEGUIDE POWER AND PHASE MONITOR

CROSS-REFERENCE TO RELATED APPLICATIONS

The present application claims the benefit of and priority to EP patent application Ser. No. 23/173,555.6, filed May 16, 2023, the entire contents of which is incorporated herein by reference.

TECHNICAL FIELD

The present description relates to monitoring of light in photonic integrated circuits, and more specifically to an optical monitoring device and a method for optical monitoring.

BACKGROUND

Photonic integrated circuits are found in a vast variety of applications. For example, these circuits are used for optical beam forming, multipath interferometers, AI (Artificial Intelligence) accelerators, photonic processing, and programmable photonics. Photonic integrated circuits are becoming increasingly more complex, combining waveguides, couplers, phase shifters, modulators, photodetectors etc. to implement complex functions for such applications. As the circuits become larger, there is also an increasing need for electrically tunable elements, such as phase shifters and tunable couplers to make the circuits tunable or re-configurable. However, as the degrees of freedom increase, so does the challenges of monitoring and controlling the light in the circuit.

It is of importance to verify that the light in a photonic integrated circuit actually flows along the paths intended. To this end, monitors need to be included in the circuit, and as the scale of the circuit increases, the number of monitors increase commensurately.

Typically, an optical monitor in a photonic integrated circuit operates by absorbing some light and converting it to an electrical photocurrent. The most straightforward manner to accomplish this is by using a photodetector, as for example a photodiode. A small fraction of the optical power in the waveguide may thus be coupled from the waveguide, and directed to the photodetector. However, photonic integrated circuits typically operate with coherent light, and therefore it is of importance to monitor also the phase of the optical signals in the waveguides. Photodetectors can measure power, however, do not measure phase directly. In order to measure phase, an additional interferometer is required. An interferometer may be used to measure the phase difference between two optical signals in two waveguides, however, only when the power of the respective signals is equal or at least known. Consequently, two monitors are required, one for monitoring the power and one for monitoring the phase.

For large-scale photonic integrated circuits an increasingly large number of detectors and electrical wiring is required. Hence, there is a need in the art for further improvements related to monitoring of light in photonic integrated circuits.

SUMMARY

An objective of the present description is to mitigate, alleviate or eliminate one or more of the above-identified deficiencies in the art and disadvantages singly or in any combination. These and other objectives are at least partly met by the invention as defined in the independent claims. Preferred embodiments are set out in the dependent claims.

According to a first aspect there is provided an optical monitoring device comprising:

a first input configured to receive a portion of a first optical signal coupled from a first waveguide into the first input;

a second input configured to receive at least a portion of a second optical signal coupled into the second input;

a mixing unit configured to control combining of the portion of the first optical signal with the at least a portion of the second optical signal into at least one combined signal at at least one output from the mixing unit; and at least one photodetector configured to detect the at least one combined signal by generating an electric signal dependent on an amplitude of the at least one combined signal incident onto the at least one photodetector;

wherein the optical monitoring device is further configured to apply a modulation signal so as to modulate at least one of a phase of the portion of the first optical signal, a coupling of the portion of the first optical signal into the first input, or an amplitude of the portion of the first optical signal being transferred into one of the at least one combined signal, and/or to modulate at least one of a phase of the at least a portion of the second optical signal, a coupling of the at least a portion of the second optical signal into the second input, or an amplitude of the at least a portion of the second optical signal being transferred into one of the at least one combined signal.

By the term "optical signal" is here meant a signal carried by electromagnetic radiation, having electric and magnetic fields that are orthogonal to each other. Typically, the electromagnetic radiation may be in the form of light. In this context the term "light" should be allowed a broad interpretation, not limited to visible electromagnetic radiation. Rather, the term "light" may also include for example ultra-violet light and infra-red light.

By the term "photodetector" is here meant any unit, device, circuit and/or element reacting to light impinging onto a light sensitive area of the photodetector, by generating an electrical signal as a response to the amplitude, or power, of the light. The photodetector may be configured to allow read-out of the electric signal representing the amplitude or power of the light. Given as non-limiting examples, the photodetector maybe a photodiode, a photoconductor, a photo-multiplier tube (PMT), or a pixel on an image detector such as a charge-coupled device (CCD) or a complementary metal oxide semiconductor sensor (CMOS).

By way of example, the optical monitoring device may be configured to monitor parameters of optical signals in a photonic integrated circuit, such as an optical phased array. By way of further example, the optical monitoring device may be an integrated part of the photonic integrated circuit, or it may alternatively be a separate optical monitoring device connectable to the photonic integrated circuit. The parameters of the optical signals that the optical monitoring device is configured to monitor may comprise power and phase of the optical signals.

The first waveguide, from which the portion of the first optical signal is coupled, may form part of the photonic integrated circuit. The first, unknown, optical signal may be propagating in the first waveguide, and a portion of the first optical signal may be coupled into the first input of the optical monitoring device for monitoring.

By way of example, the at least a portion of the second, unknown, optical signal may be coupled from a second waveguide of the photonic integrated circuit. In such a case typically a portion of the second optical signal, and thus not the second optical signal in full, may be coupled into the second input of the optical monitoring device for monitoring. By way of further example, the at least a portion of the second optical signal may be a known reference signal. The at least a portion of the second optical signal may not necessarily be coupled from the photonic integrated circuit, but may instead be coupled into the second input of the optical monitoring device from an external source, or it may be generated in the optical monitoring device. In such a case, typically the second signal in full may be coupled into the second input of the optical monitoring device for monitoring. However, it is conceivable that, alternatively, a portion of the second optical signal, and thus not the second optical signal in full, may be coupled into the second input of the optical monitoring device for monitoring.

Although only two inputs are described here for receiving two optical signals, it is conceivable that the optical monitoring device may comprise further inputs for receiving further optical signals.

The mixing unit is configured to control combining of the portion of the first optical signal with the at least a portion of the second optical signal into at least one combined signal at at least one output from the mixing unit. Control of how the signals are combined may be provided by modulation of one or more property of one or more of the two signals. In this regard, the optical monitoring device is configured to apply a modulation signal.

The optical monitoring device may be configured to modulate the phase of the portion of the first optical signal and/or the phase of the at least a portion of the second optical signal. In brief this may be referred to as phase modulation. By way of example, phase modulation may be provided by arranging a phase shifting element in the path of the optical signal to be modulated, and to modulate the phase shift generated by the phase shifting element, by applying the modulation signal to the phase shifting element.

Alternatively or additionally, the optical monitoring device may be configured to modulate the coupling of the portion of the first optical signal into the first input and/or the coupling of the at least a portion of the second optical signal into the second input. By "modulating the coupling" is here meant modulation of how large a fraction of the first/second optical signal that is coupled into the respective input. As a result, the amplitude of the portion of the first optical signal and/or the amplitude of the at least a portion of the second optical signal may be modulated. In brief this may be referred to as coupling modulation. Consequently, after the fraction of the first/second optical signal has been coupled into the respective inputs, also what remains of the first/ second optical signal e.g. in the waveguides will be modulated.

Alternatively or additionally, the optical monitoring device may be configured to modulate the amplitude of the portion of the first optical signal being transferred into one of the at least one combined signal and/or the amplitude of the at least a portion of the second optical signal being transferred into one of the at least one combined signal. Put differently, modulation of how much of the portion of the first optical signal will be mixed with the at least a portion of the second optical signal may be provided. In brief this may be referred to as mixing modulation. This may be provided after a fixed fraction of the first/second optical signal has been coupled into the respective inputs. By the present arrangement, modulation of what remains in the first/second optical signal due to modulated coupling may be avoided.

The portion of the first optical signal and the at least a portion of the second optical signal may thus be combined in the mixing unit, for example in a 50:50 optical combiner. Upon combination, the two optical signals will interfere with one another. Depending on the phase difference the two signals may provide a signal with increased power due to constructive interference, or the two optical signals may alternatively provide a signal with decreased power due to destructive interference, either partly or fully. In this manner, the at least one combined optical signal may be provided.

In its simplest form the modulation may be realized as switching between allowing the respective signals to reach the photodetector and blocking the respective signals from reaching the photodetector. If only the portion of the first optical signal is allowed to reach the photodetector, and the at least a portion of the second optical signal is blocked from reaching the photodetector, the response signal from the photodetector correspond to the amplitude, i.e. power of the first optical signal. Similarly, if only the at least a portion of the second optical signal is allowed to reach the photodetector, and the portion of the first optical signal is blocked from reaching the photodetector, the response signal from the photodetector corresponds to the amplitude, i.e. power of the second optical signal. And if both the portion of the first optical signal and the at least a portion of the second optical signal are allowed to reach the photodetector, the response signal from the photodetector corresponds to the phase difference between the two optical signals. Thus, it is conceivable that by modulating the phase, coupling, or mixing of one or both optical signals being combined, the electric signal from the photodetector may enable the respective powers of the first and second optical signals, as well as the phase difference therebetween, to be determined.

An advantage with the present arrangement is that the electric signal generated by the at least one photodetector carries information of the amplitudes of the first optical signal and the second optical signal, as well as the phase difference between the first optical signal and the second optical signal. By way of example, the at least one photodetector may be a single photodetector. In this case, an advantage is that information of the amplitudes of the first optical signal and the second optical signal, as well as the phase difference between the first optical signal and the second optical signal may be determined from the electric signal generated by the single photodetector. It should be understood that such information may be determined from the electric signal in combination with the modulation, or in combination with information thereof.

According to an embodiment, an amplitude of the portion of the first optical signal coupled from the first waveguide, is 20% or less than an amplitude of the first optical signal, and preferably 10% or less than the amplitude of the first optical signal.

An advantage with this embodiment is that a major part of the first signal originally present in the first waveguide will remain in the first waveguide, where it is needed. Thus, monitoring does not impose a significant loss in light power, which would otherwise be a disadvantage to the process being monitored.

According to an embodiment, in case the at least a portion of the second optical signal is coupled from a second waveguide in which the second optical signal is propagated, an amplitude of the at least a portion of the second optical signal coupled from the second waveguide, may be 20% or less than an amplitude of the second optical signal, and preferably 10% or less than the amplitude of the second optical signal.

An advantage with this embodiment is that monitoring does not impose a significant loss in light power since a major part of the second signal originally present in the second waveguide will remain in the second waveguide.

According to an embodiment, the optical monitoring device is in the form of a photonic integrated circuit, PIC.

An advantage with this embodiment is that a more compact and stable optical monitoring device may be provided, that enables monitoring of optical parameters such as power and phase in photonic integrated circuits.

According to an embodiment, the mixing unit further comprises:

a phase shifting element configured to receive the portion of the first optical signal, and to modulate the phase of the portion of the first optical signal in response to the modulation signal, prior to combining of the portion of the first optical signal with the at least a portion of the second optical signal into the at least one combined signal.

As the portion of the first optical signal propagates through the phase shifting element, the phase of the portion of the first optical signal may be modulated with respect to the at least a portion of the second optical signal. The two optical signals may subsequently be combined, for example in a 50:50 optical combiner. Upon combination of the two optical signals, the optical signals will interfere with one another. Depending on the phase difference the two signals may provide a combined signal with increased power due to constructive interference, or the two signals may alternatively provide a combined signal with decreased power due to destructive interference, either partly or fully.

By way of example, the phase shifting element may be a thermo-optic phase shifting element. A thermo-optic phase shifting element provides a tunable phase shift as a function of the temperature of the phase shifting element. Thus, by controlling the temperature of the phase shifting element, the resulting phase shift may be controlled. Given as a non-limiting example, a thermo-optic phase shifting element may be realized as a heater provided on a waveguide, through which the portion of the first optical signal may propagate. By heating the waveguide, the refractive index of the waveguide may change, and typically increase. As the refractive index changes, typically the optical path length through the phase shifting element is changed, thereby changing the phase of the light exiting the phase shifting element.

An advantage with this embodiment is that a constant coupling from the first waveguide to the first input may be used. By the present arrangement, the modulation does not affect the remaining first optical signal in the first waveguide.

It serves to mention that, as an alternative, the mixing unit may comprise a phase shifting element configured to receive the at least a portion of the second optical signal, and to modulate the phase of the at least a portion of the second optical signal in response to the modulation signal, prior to combining of the two signals. As yet another alternative, the mixing unit may comprise a phase shifting element in the path of each of the two optical signals, configured to independently modulate the phase of the two optical signals, respectively.

According to an embodiment, the mixing unit further comprises:

a Mach-Zehnder interferometer configured to receive the portion of the first optical signal and the at least a portion of the second optical signal, and to modulate, in response to the modulation signal, an amplitude of the portion of the first optical signal being transferred into one of the at least one combined signal.

The Mach Zehnder interferometer is configured to tunably control the amplitude of the portion of the first optical signal. By way of example, the transmission of the portion of the first optical signal through the Mach Zehnder interferometer may vary between 0% and 100%.

In the Mach Zehnder interferometer, the received optical signals are first combined in a 50:50 optical combiner, and subsequently split up into two separate waveguide arms. By applying an electric field across one of the arms, the optical path length through the arm may change, thereby resulting in a phase shift for the light passing through that arm. By modulating the electric field, a modulated phase shift may be provided. Upon recombination of the light in the two arms, the modulated phase difference between the two signals results in an amplitude modulation. Thus, by modulating the electric field across one of the two waveguide arms, a modulated amplitude control element may be provided.

By the present arrangement, the mixing ratio between the portion of the first optical signal and the at least a portion of the second optical signal may be varied between 0% and 100%.

An advantage with this embodiment is that a constant coupling from the first waveguide to the first input may be used. By the present arrangement, the modulation does not affect the remaining first optical signal in the first waveguide.

It serves to mention that, alternatively or additionally, the Mach-Zehnder interferometer may be configured to modulate an amplitude of the at least a portion of the second optical signal being transferred into one of the at least one combined signal.

According to an embodiment, the optical monitoring device further comprises:

a dynamic coupling element configured to tunably couple the portion of the first optical signal from the first waveguide such that an amplitude of the portion of the first optical signal, coupled from the first waveguide, is controllable;

wherein the optical monitoring device is further configured to apply a modulation signal to the dynamic coupling element so as to modulate the coupling of the portion of the first optical signal in response to the modulation signal.

In other words, the amount of light coupled from the first waveguide and into the first input is modulated. It should be understood that since the amount of light coupled from the first waveguide is modulated, the modulation also affects the remaining first optical signal in the first waveguide.

Given as a non-limiting example, the dynamic coupling element may be implemented as a directional coupler where the modulation signal controls a phase matching between the first waveguide and a coupling waveguide. The coupling mechanism may be based on heaters, liquid crystals, Pockels effect, or any other electro-optic effect.

Given as another non-limiting example, the dynamic coupling element may be implemented as a Mach-Zehnder interferometer, using the modulation signal to drive a phase shifting element.

Given as another non-limiting example, the dynamic coupling element may be implemented as a waveguide MEMS (MicroElectroMechanical Systems) device. In such a MEMS device, a coupling waveguide is moved in proximity of the first waveguide. By way of example, mechanical stoppers could provide a fixed, known reference coupling value. Moreover, to set the dynamic coupling element in an 'off' state, the coupling waveguide is physically separated from the first waveguide such that no coupling is provided, and thus does not introduce any losses in the first waveguide.

The portion of the first optical signal and the at least a portion of the second optical signal may subsequently be combined in the mixing unit, for example in a 50:50 optical combiner. In this manner, the at least one combined optical signal may be provided.

It serves to mention that, in case the second optical signal is provided in a second waveguide, and if the at least a portion of the second optical signal is coupled from the second waveguide, the coupling may be provided by another dynamic coupling element configured to tunably couple the at least a portion of the second optical signal from the second waveguide. The optical monitoring device may be further configured to apply a modulation signal to the other dynamic coupling element so as to modulate the coupling of the at least a portion of the second optical signal in response to the modulation signal.

An advantage with this embodiment is that a simple implementation of the optical monitoring device may be provided, requiring only few components for providing modulated signals.

According to an embodiment, the at least one combined signal comprises a first combined signal and a second combined signal, wherein the at least one output from the mixing unit comprises a first output and a second output, and wherein the mixing unit is further configured to control combining of the portion of the first optical signal with the at least a portion of the second optical signal into the first combined signal at the first output, and into the second combined signal at the second output.

By way of example, either of the first combined signal and the second combined signal may be detected by a single photodetector of the at least one photodetector. However, with the first output and the second output, outputting the first combined signal and the second combined signal, respectively, the present embodiment also allows for dual readout of the two signals by means of a first photodetector and a second photodetector.

According to an embodiment, the at least one photodetector comprises a first photodetector and a second photodetector, and wherein the first photodetector is configured to detect the first combined signal and the second photodetector is configured to detect the second combined signal.

An advantage with this embodiment is that more measurements of the combined signals may be acquired, and with more measurements a more accurate determination of the respective powers of the optical signals and the phase difference therebetween may be provided.

According to an embodiment, the first photodetector and the second photodetector are combined into a balanced photodetector.

By a balanced photodetection is here meant a device comprising two photodiodes connected in series. When the two photo diodes detect the same level of light, i.e. when their generated electric signals are equal, their electric signals cancel each other out. By the present arrangement, detection of small differences in light level on the two photodetectors may be provided.

According to an embodiment, the modulation signal is a periodic modulation signal.

By way of example, the periodic modulation signal may follow the actual clean modulation according to which the modulation of the property, i.e. phase, amplitude, or coupling, is intended to follow. However, it is conceivable that the response of the respective elements, i.e. phase shifting element, Mach Zehnder interferometer, dynamic coupling element, etc., may show irregularities and/or non-linearities in the response with respect to the received modulation signal. Given as a non-limiting example, the periodic modulation signal may thus be pre-distorted and/or pre-compensated for such behavior. In this manner, a cleaner modulation response may be provided and thus a cleaner signal may be provided to the photodetector. By way of example, pre-distortion or pre-compensated may be applied by simple analog electronics.

According to an embodiment, the modulation signal is a sinusoidal modulation signal.

An advantage with this embodiment is that components and electronics for generating a sinusoidal modulation signal is readily available, and may be easily provided and at a low cost.

According to an embodiment, the optical monitoring device further comprises a processing unit configured to receive the electric signal from the at least one photodetector and to determine, from the electric signal received and the modulation signal, an amplitude of the first optical signal, an amplitude of the second optical signal, and an optical phase difference between the first optical signal and the second optical signal.

The processing unit may be arranged internally in, or on a surface of, the optical monitoring device. Alternatively, the processing unit may be arranged in an external unit, such that the determination of the amplitudes of the optical signals and the phase difference therebetween may take place elsewhere. The electric signal from the at least one photodetector, or data of the same, may be transferred to the processing unit, either by a wired connection or wirelessly. As yet another alternative, the processing unit may be distributed among physical units, such that parts of the determination of amplitudes and phase difference may be performed in different physical units.

According to a second aspect there is provided a method for optical monitoring, the method comprising:

receiving, at a first input, a portion of a first optical signal coupled from a first waveguide into the first input;

receiving, at a second input, at least a portion of a second optical signal coupled into the second input;

controlling, by a mixing unit, combining of the portion of the first optical signal with the at least a portion of the second optical signal into at least one combined signal at at least one output from the mixing unit;

applying a modulation signal so as to modulate at least one of a phase of the portion of the first optical signal, a coupling of the portion of the first optical signal into the first input, or an amplitude of the portion of the first optical signal being transferred into one of the at least one combined signal, and/or to modulate at least one of a phase of the at least a portion of the second optical signal, a coupling of the at least a portion of the second optical signal into the second input, or an amplitude of the at least a portion of the second optical signal being transferred into one of the at least one combined signal; and detecting, by at least one photodetector, the at least one combined signal by generating an electric signal dependent on an amplitude of the at least one combined signal incident onto the at least one photodetector.

Effects and features of the second aspect are largely analogous to those described above in connection with the first aspect. Embodiments mentioned in relation to the first aspect are largely compatible with the second aspect. It is further noted that the inventive concepts relate to all possible combinations of features unless explicitly stated otherwise.

Other objectives, features and advantages of the present inventive concept will appear from the following detailed disclosure, from the attached claims as well as from the drawings.

BRIEF DESCRIPTIONS OF THE DRAWINGS

The above, as well as additional objects, features and advantages of the present description, will be better understood through the following illustrative and non-limiting detailed description, with reference to the appended drawings. In the drawings like reference numerals will be used for like elements unless stated otherwise.

FIG. 1 schematically illustrates an optical monitoring device using phase modulation.

Figure 2:
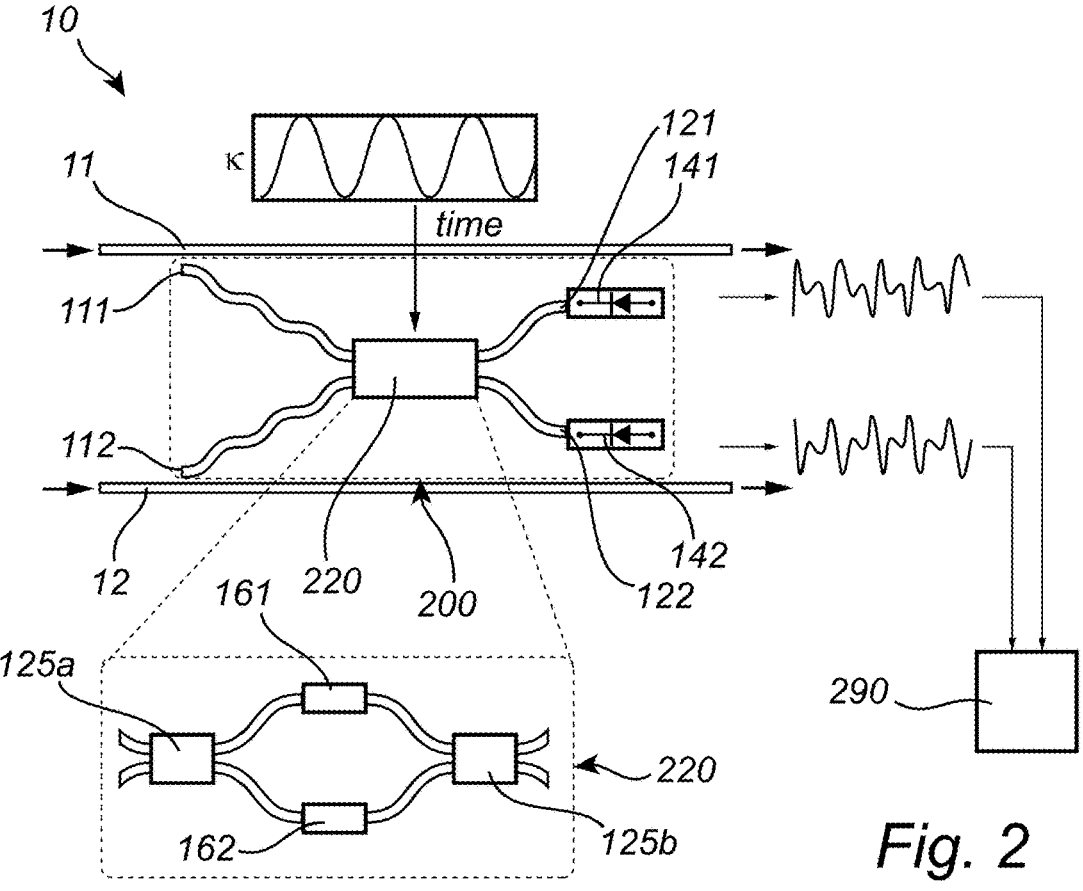

FIG. 2 schematically illustrates an optical monitoring device 200 using mixing modulation.

Figure 3:
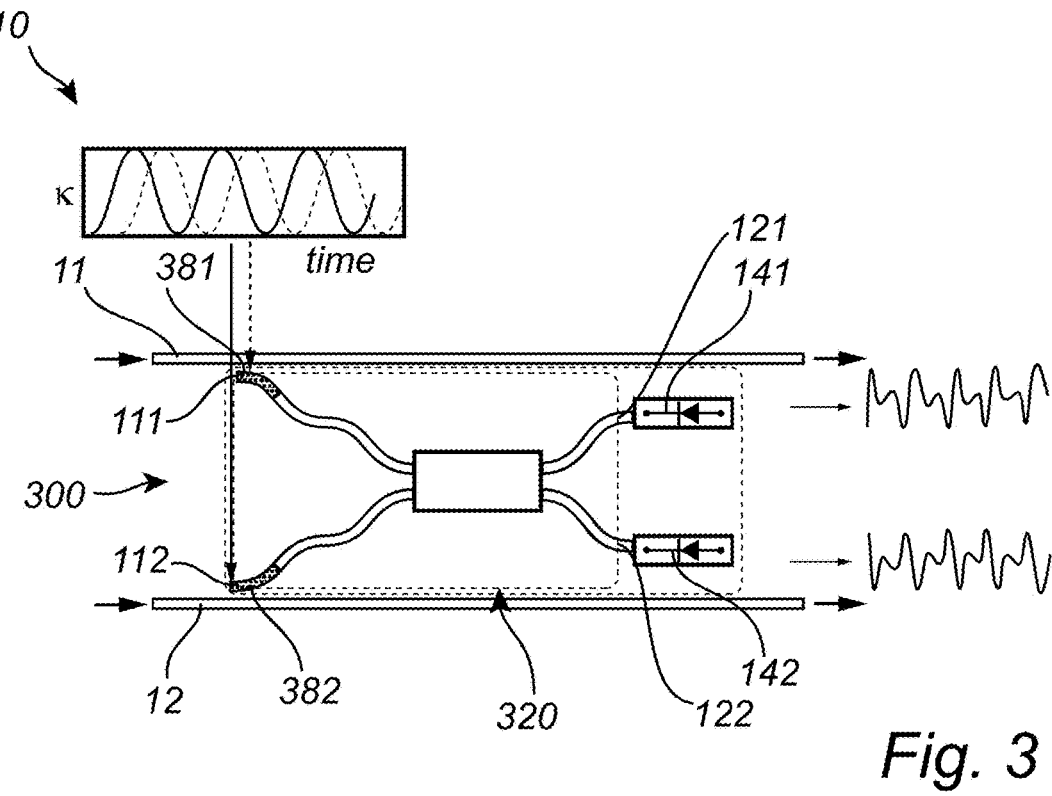

FIG. 3 schematically illustrates an optical monitoring device 300 using coupling modulation.

Figure 4:
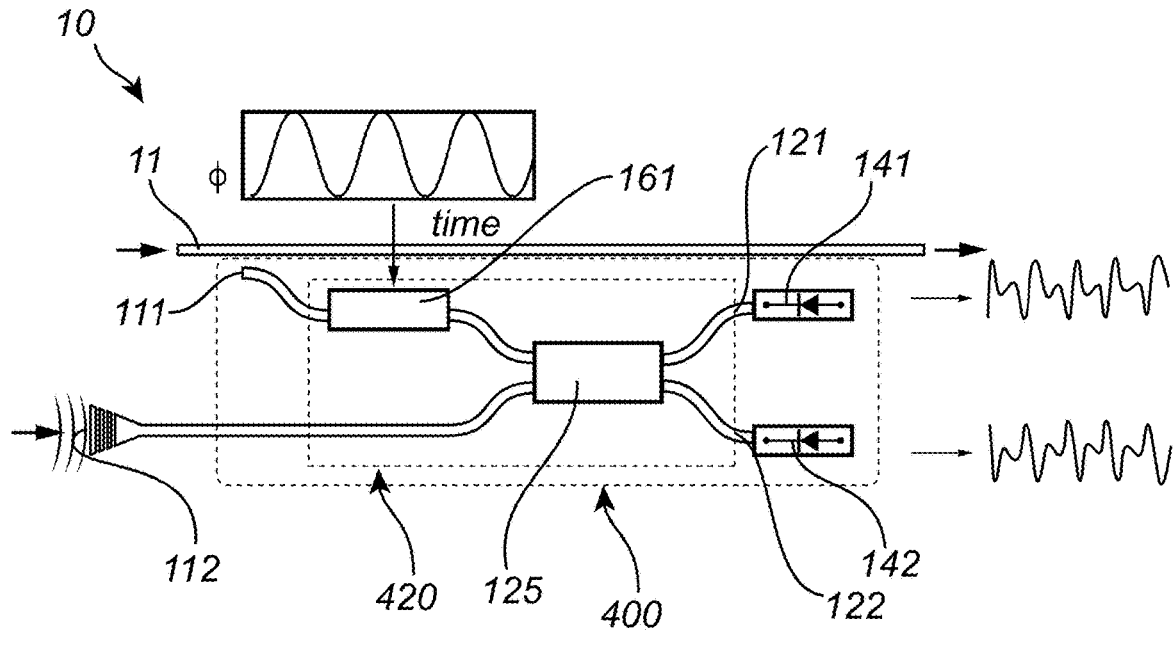

FIG. 4 schematically illustrates an optical monitoring device using phase modulation for monitoring one optical signal in a photonic integrated circuit in comparison with a reference signal.

FIG. 5 illustrates a schematic block diagram shortly summarizing the method for optical monitoring.

DETAILED DESCRIPTION

In cooperation with attached drawings, the technical contents and detailed description of the present inventive concept are described thereinafter according to a preferable embodiment, being not used to limit the claimed scope. This inventive concept may be embodied in many different forms and should not be construed as limited to the embodiments set forth herein; rather, these embodiments are provided for thoroughness and completeness, and fully convey the scope of the inventive concept to the skilled person.

FIG. 1 schematically illustrates an optical monitoring device 100 using phase modulation. The optical monitoring device 100 is configured as being part of a photonic integrated circuit 10, which integrated circuit 10 comprises a first waveguide 11 and a second waveguide 12. However, it should be understood that the optical monitoring device 100 may alternatively be configured as a device separate from, but connectable to the photonic integrated circuit 10.

The first waveguide 11 is configured to propagate a first optical signal and the second waveguide 12 is configured to propagate a second optical signal. The optical monitoring device 100 comprises a first input 111 and a second input 112. For the purpose of monitoring the optical signals in the photonic integrated circuit 10, a portion of a first optical signal may be coupled from a first waveguide 11 into the first input 111 of the optical monitoring device 100. Further, at least a portion of a second optical signal may be coupled from the second waveguide 12 into the second input 112 of the optical monitoring device 100.

In order not to drain the optical signals in the respective waveguides, and thereby negatively affecting the performance of the photonic integrated circuit 10, typically only a small portion of the optical signals are coupled into the optical monitoring device 100. By way of example, the respective amplitude of the portion of the optical signal coupled from the waveguides 11, 12, is 20% or less, and preferably 10% or less than the amplitude of the optical signal originally in the respective waveguides 11, 12. In the present example, the degree of coupling is fixed, such that the remaining optical signals in the respective waveguides 11, 12 are not affected by variations due to varying degree of coupling.

The optical monitoring device 100 further comprises a mixing unit 120. The portion of the first optical signal coupled from the first waveguide 11, and the at least a portion of the second optical signal coupled from the second waveguide 12 are guided to the mixing unit 120.

The mixing unit 120 comprises a first phase shifting element 161 configured to receive the portion of the first optical signal. The phase shifting element 161 is further configured to modulate the phase of the portion of the first optical signal passing therethrough, in response to a modulation signal. As illustrated in FIG. 1, the mixing unit 120 may optionally also comprise a second phase shifting element 162, receiving the at least a portion of the second optical signal, and to modulate the phase of this signal.

By way of example, the modulation signal may be a periodic modulation signal, such as a sinusoidal modulation signal or a square wave modulation signal.

The optical monitoring device 100 may thus apply a modulation signal to modulate a phase of the portion of the first optical signal, and/or to modulate a phase of the at least a portion of the second optical signal. The modulation signal applied to the first phase shifting element 161 may be the same as the modulation signal applied to the second phase shifting element 162. However, typically the modulation signal applied to the first phase shifting element 161 is different from the modulation signal applied to the second phase shifting element 162.

In the mixing unit 120 the two optical signals are subsequently combined by means of a 50:50 optical combiner 125. Upon combination, the two optical signals interfere with one another. Depending on the phase difference therebetween, the two signals may engage in constructive interference or destructive interference so as to either increase or decrease the power of the combined signal. In the mixing unit 120 the two optical signals are combined into at least one, and in this case two combined signals, i.e. a first combined signal and a second combined signal. The first combined signal and the second combined signal are output from the mixing unit 120 at a first output 121 and a second output 122, respectively.

By controlling the phase shift of the portion of the first optical signal with respect to the at least a portion of the second optical signal by means of the first and second phase shifting elements 161, 162, the mixing unit 120 may to control combining of the two optical signals.

The optical monitoring device 100 further comprises a first photodetector 141 and a second photodetector 142. The first photodetector 141 is configured to detect the first combined signal from the first output 121. Further, the second photodetector 142 is configured to detect the second combined signal from the second output 122. Each of the first and second photodetectors 141, 142 is configured to generate an electric signal dependent on the amplitude, or power, of the respective combined signal incident onto the at least one photodetector 141, 142.

Each of the combined signals may be modulated due to the modulation of the phase shifts. The combined signals will be detected by the respective photodetector 141, 142 and will be converted to electric signals. These modulated electric signals carry information about the amplitude, or power, of each of the first optical signal and the second optical signal, as well as the phase difference therebetween. Thus, from the electric signals detected by the first photodetector 141 and the second photodetector 142, respectively, the respective powers and the phase difference may subsequently be determined.

It should be understood that the optical monitoring device 100 may alternatively comprise a single photodetector 141, although two photodetectors 141, 142 are illustrated here. However, using two photodetectors may enhance the quality of the measurement and thus improve the accuracy of the measurement results. Further, it should be understood that the first photodetector 141 and the second photodetector 142 may be combined into a balanced photodetector. By the present arrangement, detection of small differences in light level on the two photodetectors 141, 142 may be provided.

The photonic integrated circuit 10 may comprise a plurality of waveguides with a plurality of optical signals, such as 100 or 1000 waveguides. It is conceivable that a plurality of optical monitoring devices 100 are employed in order to monitor the plurality of optical signals in such a photonic integrated circuit 10. As an alternative, it is conceivable that an optical monitoring device may comprise more than two inputs, in order to monitor and compare more than only two optical signals in the photonic integrated circuit 10.

FIG. 2 schematically illustrates an optical monitoring device 200 using mixing modulation. The optical monitoring device 200 is configured for monitoring the optical signals in the photonic integrated circuit 10. The optical monitoring device 200 shares some of the features with optical measurement device 100 described in relation to FIG. 1, the details of which are not repeated here.

A portion of a first optical signal may be coupled from the first waveguide 11 into the first input 111 of the optical monitoring device 200. At least a portion of a second optical signal may be coupled from the second waveguide 12 into the second input 112 of the optical monitoring device 200. In the present example, the degree of coupling is fixed, such that the remaining optical signals in the respective waveguides 11, 12 are not affected by variations due to varying degree of coupling.

The optical monitoring device 200 comprises a mixing unit 220, to which the two signals are guided individually. The mixing unit 220 comprises a Mach-Zehnder interferometer. The Mach-Zehnder interferometer comprises a first 50:50 optical combiner 125*a*, configured to receive the two optical signals and combine them. The combination is subsequently split up into two paths, as for example two separate waveguide arms. The two arms are provided with a first and a second phase shifting element 161, 162, respectively. If an electric field is applied across one of the phase shifting elements 161, 162, the optical path length through the arm may change. In this manner a phase shift for the signal passing through that arm may be provided. Modulation of the electric field across one or both of the two phase shifting elements 161, 162, may provide a modulated amplitude control element.

The two optical signals are subsequently combined again in a second 50:50 optical combiner 125*b*, wherein the optical signals may interfere with one another. As illustrated in FIG.

2, a first and a second output 121, 122 are provided in the mixing unit 220, for a first and a second combined signal respectively. By the present arrangement, the mixing ratio between the portion of the first optical signal and the at least a portion of the second optical signal may be varied between 0% and 100%, respectively.

The Mach-Zehnder interferometer may modulate, in response to the modulation signal, an amplitude of the portion of the first optical signal being transferred into the first and a second combined signal, respectively. Moreover, the Mach-Zehnder interferometer may modulate an amplitude of the at least a portion of the second optical signal being transferred into the first and a second combined signal, respectively. In the manner described above, the mixing unit 220 may provide modulation of the coupling between the two signals in the mixing unit 220.

The optical monitoring device 200 further comprises a first photodetector 141 and a second photodetector 142, configured to detect the first and second combined signals from the first and second outputs 121, 122, respectively.

The modulated electric signals from the photodetectors 141, 142 carry information about the amplitude, or power, of each of the first optical signal and the second optical signal, as well as the phase difference therebetween, allowing these parameters to be subsequently determined.

As illustrated in FIG. 2, the optical monitoring device 200 further comprises a processing unit 290. The processing unit 290 may receive the electric signals from the first and second photodetectors 141, 142. The processing unit 290 may further receive 5 information about the modulation signal modulating the phase shifting elements 161, 162 in the mixing unit 220. Based on this information, the processing unit 290 may determine the amplitude of the first optical signal, the amplitude of the second optical signal, and the optical phase difference between the first optical signal and the second optical signal.

It should be understood that the amplitude or power of the first optical signal and the second optical signal, respectively, and the phase difference therebetween, may be determined from the electric signals of the photodetectors through a number of different methods. By way of example, these quantities may be determined by using analytical calculations, lookup tables, fitting techniques, or a combination thereof.

One possible implementation, based on a sinusoidal modulation with a fixed frequency f (e.g. f=10 kHz) is to monitor the relative strength of this periodic component in the output electric signal of the photodetector, as well as the intensity and electrical phase delay of the higher harmonics 2f, 3f, . . . (e.g. 20 kHz, 30 kHz, . . . ). The relative strength of these harmonics, as well as their relative phase delay, may be mapped on the optical amplitudes and optical phase difference in the two input waveguides. Given as non-limiting examples, the mapping may be constructed using analytical formulas, circuit simulation, or experimental calibration with known input signals.

FIG. 3 schematically illustrates an optical monitoring device 300 using coupling modulation. The optical monitoring device 300 is configured for monitoring the optical signals in the photonic integrated circuit 10. The optical monitoring device 300 shares some of the features with optical measurement device 100 described in relation to FIG. 1 and with optical measurement device 200 described in relation to FIG. 2, the details of which are not repeated here.

A portion of a first optical signal may be coupled from the first waveguide 11 into the first input 111 of the optical monitoring device 300. At least a portion of a second optical signal may be coupled from the second waveguide 12 into the second input 112 of the optical monitoring device 300. In the present example, the degree of coupling is variable or tunable. Thus, the optical monitoring device 300 comprises a first dynamic coupling element 381 configured to tunably couple the portion of the first optical signal from the first waveguide 11 such that an amplitude of the portion of the first optical signal, coupled from the first waveguide 11, is controllable. As illustrated in FIG. 3, the optical monitoring device 300 may optionally comprise a second dynamic coupling element 382 configured to tunably couple the at least a portion of the second optical signal from the second waveguide 12 such that an amplitude of the at least a portion of the second optical signal, coupled from the second waveguide 12, is controllable. Modulation of the amplitudes of the two signals may be provided by applying a modulation signal to the respective dynamic coupling elements 381, 382, so as to modulate the coupling of the portion of the first optical signal and the at least a portion of the second optical signal in response to the respective modulation signals.

It should be noted that, in the present arrangement the coupling from the waveguides 11,12 to the optical monitoring device 300 is modulated, and thus, the remaining optical signals in the respective waveguides 11, 12 may be affected by variations due to varying degree of coupling.

The mixing unit 320 of the optical monitoring device 300 comprises a 50:50 optical combiner 125, configured to receive the two optical signals and combine them. In the 50:50 optical combiner 125 the optical signals may interfere with one another. As illustrated in FIG. 3, a first and a second output 121, 122 are provided in the mixing unit 320, for a first and a second combined signal respectively. By the present arrangement, the mixing ratio between the portion of the first optical signal and the at least a portion of the second optical signal may be varied between 0% and 100%, respectively.

The optical monitoring device 300 further comprises a first photodetector 141 and a second photodetector 142, configured to detect the first and second combined signals from the first and second outputs 121, 122, respectively. The modulated electric signals from the photodetectors 141, 142 carry information about the amplitude, or power, of each of the first optical signal and the second optical signal, as well as the phase difference therebetween, allowing these parameters to be subsequently determined.

FIG. 4 schematically illustrates an optical monitoring device 400 using phase modulation. The optical monitoring device 400 is configured for monitoring one optical signal in the photonic integrated circuit 10 in comparison with a reference signal. The optical monitoring device 400 shares some of the features with optical measurement devices 100, 200, 300 described in relation to FIG. 1-3, respectively, the details of which are not repeated here.

A portion of a first optical signal may be coupled from the first waveguide 11 into the first input 111 of the optical monitoring device 400. In the present example, the degree of coupling is fixed, such that the remaining optical signal in the waveguides 11 is not affected by variations due to varying degree of coupling. Further, at least a portion of a second optical signal, in this case the reference signal, may be coupled into the second input 112 of the optical monitoring device 400. By way of example, the reference signal may be coupled in full into the second input 112 of the optical monitoring device 400. In the optical monitoring device 400, instead of comparing two optical signals of the photonic integrated circuit 10, a single optical signal of the photonic integrated circuit 10 may be compared to the reference signal. The reference signal may be well known in terms of power and phase.

The optical monitoring device 400 further comprises a mixing unit 420. The mixing unit 420 comprises a first phase shifting element 161 configured to receive the portion of the first optical signal. The first phase shifting element 161 is further configured to modulate the phase of the portion of the first optical signal passing therethrough, in response to a modulation signal. Although not illustrated here, it should be understood that the mixing unit 420 may optionally comprise a second phase shifting element, configured to receive the reference signal, and to modulate the phase of the reference signal. As another alternative, phase modulation may be provided to the reference signal only, but not to the portion of the first optical signal.

In the mixing unit 420 the two optical signals are subsequently combined by means of a 50:50 optical combiner 125, wherein the two optical signals may interfere with one another. As illustrated in FIG. 4, a first and a second output 121, 122 are provided in the mixing unit 220, for a first and a second combined signal, respectively.

The first and second combined signals from the first and second outputs 121, 122, may be detected by photodetectors 141, 142. As in the previous embodiments, the modulated electric signals from the photodetectors 141, 142 carry information about the amplitude, or power, of each of the first optical signal and the reference signal, as well as the phase difference therebetween. However, in the present embodiment the reference signal may be known, and subsequent determination of information about the amplitude and phase difference may be simplified.

As described herein, instead of comparing two optical signals of the photonic integrated circuit 10, a single optical signal of the photonic integrated circuit 10 may be compared to the reference signal. It is conceivable that a plurality of optical monitoring devices 400 are employed in order to monitor a plurality of optical signals in a photonic integrated circuit 10 comprising a plurality of waveguides, or alternatively that an optical monitoring device may comprise more than two inputs, in order to monitor and compare more than two optical signals in the photonic integrated circuit 10. In such cases it is conceivable that the reference signal may be distributed globally on the photonic integrated circuit. By way of example, the global distribution of the reference signal may be provided by a separate waveguide network. Preferably, such a waveguide network should be balanced, such that the light arrives in phase at the different locations of the plurality of optical monitoring devices. By way of further example, the reference signal may be provided from a plane above or below the plane of the photonic integrated circuit, by means of a collimated plane wave of light. At the locations of the optical monitoring devices, a grating coupler may couple the plane wave onto the photonic integrated circuit 10.

As an alternative to using phase modulation in the optical monitoring device 400, either coupling modulation or mixing modulation may be used instead, either for the first optical signal or for the reference signal, or for both. As yet another alternative, modulation may be provided externally, such that the reference signal is modulated prior to entering the optical monitoring device.

FIG. 5 illustrates a schematic block diagram shortly summarizing the method for optical monitoring. It should be understood that the steps of the method, although listed in a specific order herein, may be performed in any order suitable.

The method may comprise receiving S501, at a first input, a portion of a first optical signal coupled from a first waveguide into the first input.

The method may comprise receiving S502, at a second input, at least a portion of a second optical signal coupled into the second input.

The method may comprise controlling S503, by a mixing unit, combining of the portion of the first optical signal with the at least a portion of the second optical signal into at least one combined signal at at least one output from the mixing unit.

The method may comprise applying S504 a modulation signal so as to modulate at least one of a phase of the portion of the first optical signal, a coupling of the portion of the first optical signal into the first input, or an amplitude of the portion of the first optical signal being transferred into one of the at least one combined signal, and/or to modulate at least one of a phase of the at least a portion of the second optical signal, a coupling of the at least a portion of the second optical signal into the second input, or an amplitude of the at least a portion of the second optical signal being transferred into one of the at least one combined signal.

The method may comprise detecting S505, by at least one photodetector, the at least one combined signal by generating an electric signal dependent on an amplitude of the at least one combined signal incident onto the at least one photodetector.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An optical monitoring device comprising:
a first input configured to receive, from a first optical signal propagating in a first waveguide, a portion of the first optical signal coupled from the first waveguide into the first input of the optical monitoring device;
a second input configured to receive at least a portion of a second optical signal coupled into the second input;
a mixing unit configured to control combining of the portion of the first optical signal with the at least a portion of the second optical signal into at least one combined signal at at least one output from the mixing unit; and
at least one photodetector configured to detect the at least one combined signal by generating an electric signal dependent on an amplitude of the at least one combined signal incident onto the at least one photodetector,
wherein the optical monitoring device is further configured to apply a modulation signal in the mixing unit so as to modulate, after the portion of the first optical signal having been coupled from the first waveguide into the first input, at least one of a phase of the portion of the first optical signal, or an amplitude of the portion of the first optical signal being transferred into one of the at least one combined signal, and/or to modulate, after the at least a portion of the second optical signal having been coupled into the second input, at least one of a phase of the at least a portion of the second optical signal, or an amplitude of the at least a portion of the second optical signal being transferred into one of the at least one combined signal.

2. The optical monitoring device according to claim 1, wherein an amplitude of the portion of the first optical signal coupled from the first waveguide, is 20% or less than an amplitude of the first optical signal, and preferably 10% or less than the amplitude of the first optical signal.

3. The optical monitoring device according to claim 1, wherein the optical monitoring device is in the form of a photonic integrated circuit, PIC.

4. The optical monitoring device according to claim 1, configured to apply a modulation signal so as to modulate the phase of the portion of the first optical signal, wherein the mixing unit further comprises:
a phase shifting element configured to receive the portion of the first optical signal, and to modulate the phase of the portion of the first optical signal in response to the modulation signal, prior to combining of the portion of the first optical signal with the at least a portion of the second optical signal into the at least one combined signal.

5. The optical monitoring device according to claim 1, configured to apply a modulation signal so as to modulate the amplitude of the portion of the first optical signal, wherein the mixing unit further comprises:
a Mach-Zehnder interferometer configured to receive the portion of the first optical signal and the at least a portion of the second optical signal, and to modulate, in response to the modulation signal, the amplitude of the portion of the first optical signal being transferred into one of the at least one combined signal.

6. The optical monitoring device according to claim 1, wherein the at least one combined signal comprises a first combined signal and a second combined signal,
wherein the at least one output from the mixing unit comprises a first output and a second output, and
wherein the mixing unit is further configured to control combining of the portion of the first optical signal with the at least a portion of the second optical signal into the first combined signal at the first output, and into the second combined signal at the second output.

7. The optical monitoring device according to claim 6, wherein the at least one photodetector comprises a first photodetector and a second photodetector, and
wherein the first photodetector is configured to detect the first combined signal and the second photodetector is configured to detect the second combined signal.

8. The optical monitoring device according to claim 7, wherein the first photodetector and the second photodetector are combined into a balanced photodetector.

9. The optical monitoring device according to claim 1, wherein the modulation signal is a periodic modulation signal.

10. The optical monitoring device according to claim 9, wherein the modulation signal is a sinusoidal modulation signal.

11. The optical monitoring device according to claim 1, further comprising a processing unit configured to receive the electric signal from the at least one photodetector and to determine, from the electric signal received and the modulation signal, an amplitude of the first optical signal, an amplitude of the second optical signal, and an optical phase difference between the first optical signal and the second optical signal.

12. A method for optical monitoring, the method comprising:
receiving, from a first optical signal propagating in a first waveguide, a portion of the first optical signal coupled from the first waveguide into a first input of an optical monitoring device;

receiving, from a second optical signal, at least a portion of the second optical signal coupled into the second input of the optical monitoring device;

controlling, by a mixing unit, combining of the portion of the first optical signal with the at least a portion of the second optical signal into at least one combined signal at at least one output from the mixing unit;

applying a modulation signal in the mixing unit so as to modulate, after the portion of the first optical signal having been coupled from the first waveguide into the first input, at least one of a phase of the portion of the first optical signal, or an amplitude of the portion of the first optical signal being transferred into one of the at least one combined signal, and/or to modulate, after the at least a portion of the second optical signal having been coupled into the second input, at least one of a phase of the at least a portion of the second optical signal, or an amplitude of the at least a portion of the second optical signal being transferred into one of the at least one combined signal; and detecting, by at least one photodetector, the at least one combined signal by generating an electric signal dependent on an amplitude of the at least one combined signal incident onto the at least one photodetector.

13. An optical monitoring device comprising:

a first input configured to receive a portion of a first optical signal coupled from a first waveguide into the first input;

a second input configured to receive at least a portion of a second optical signal coupled into the second input;

a mixing unit configured to control combining of the portion of the first optical signal with the at least a portion of the second optical signal into at least one combined signal at at least one output from the mixing unit;

at least one photodetector configured to detect the at least one combined signal by generating an electric signal dependent on an amplitude of the at least one combined signal incident onto the at least one photodetector, wherein the optical monitoring device is further configured to apply a modulation signal so as to modulate at least one of a phase of the portion of the first optical signal, a coupling of the portion of the first optical signal into the first input, or an amplitude of the portion of the first optical signal being transferred into one of the at least one combined signal, and/or to modulate at least one of a phase of the at least a portion of the second optical signal, a coupling of the at least a portion of the second optical signal into the second input, or an amplitude of the at least a portion of the second optical signal being transferred into one of the at least one combined signal; and a dynamic coupling element configured to tunably couple the portion of the first optical signal from the first waveguide such that an amplitude of the portion of the first optical signal, coupled from the first waveguide, is controllable, wherein the optical monitoring device is further configured to apply a modulation signal to the dynamic coupling element so as to modulate the coupling of the portion of the first optical signal in response to the modulation signal.

* * * * *